United States Patent
Shen

(10) Patent No.: US 10,686,240 B2
(45) Date of Patent: Jun. 16, 2020

(54) BALUN CIRCUIT ARRANGEMENT

(71) Applicant: Qorvo International PTE. LTD., Singapore (SG)

(72) Inventor: Yilong Shen, Nijmegen (NL)

(73) Assignee: Qorvo International PTE. LTD., Singapore (SG)

(*) Notice: Subject to any disclaimer, the term of this patent is extended or adjusted under 35 U.S.C. 154(b) by 27 days.

(21) Appl. No.: 16/097,047

(22) PCT Filed: May 26, 2016

(86) PCT No.: PCT/NL2016/050375
§ 371 (c)(1),
(2) Date: Oct. 26, 2018

(87) PCT Pub. No.: WO2017/204621
PCT Pub. Date: Nov. 30, 2017

(65) Prior Publication Data
US 2019/0157740 A1 May 23, 2019

(51) Int. Cl.
*H03H 7/42* (2006.01)
*H01P 5/10* (2006.01)
*H04B 1/04* (2006.01)

(52) U.S. Cl.
CPC .......... *H01P 5/10* (2013.01); *H03H 7/42* (2013.01); *H04B 1/0475* (2013.01)

(58) Field of Classification Search
CPC ................................. H01P 5/10; H03H 7/42
USPC ........................................................ 333/25
See application file for complete search history.

(56) References Cited

U.S. PATENT DOCUMENTS

| 6,952,142 B2* | 10/2005 | Guitton | H03H 7/42 333/177 |
| 10,447,227 B2* | 10/2019 | Le | H03H 7/422 |
| 2003/0042992 A1 | 3/2003 | Frank | |
| 2009/0315636 A1 | 12/2009 | Tamaru | |
| 2013/0033336 A1 | 2/2013 | Tanaka | |

OTHER PUBLICATIONS

Bashir, Imran, et al., "A Novel Approach for Mitigation of RF Oscillator Pulling in a Polar Transmitter," IEEE Journal of Solid-State Circuits, vol. 46, Issue 2, Feb. 2011, pp. 403-415.

(Continued)

*Primary Examiner* — Dean O Takaoka
(74) *Attorney, Agent, or Firm* — Withrow & Terranova, P.L.L.C.

(57) ABSTRACT

Balun circuit arrangement with a balanced port side having two balanced terminals and an unbalanced port side having an unbalanced terminal. A first series connection of a first inductive impedance element (L1) and a first capacitive impedance element (C1) is present between a negative terminal of the two balanced terminals and the unbalanced terminal. A second series connection of a second inductive impedance element (L2) and a third inductive impedance element (L3) is present between a positive terminal of the two balanced terminals and the unbalanced terminal, and a second capacitive element (C2) is connected between a node connecting the second and third inductive element and a ground connection. The balun circuit arrangement may be used in a combination with an oscillator circuit and a single ended antenna.

15 Claims, 2 Drawing Sheets

(56) References Cited

OTHER PUBLICATIONS

Puma, Giuseppe Li, et al., "Mitigation of Oscillator Pulling in SoC's," IEEE Journal of Solid-State Circuits, vol. 51, Issue 2, Feb. 2016, pp. 348-356.
Razavi, Behzad, "A Study of Injection Pulling and Locking in Oscillators," Custom Integrated Circuits Conference, 2003, IEEE, pp. 305-312.
Tsai, King-Chun, et al., "A 1.9-GHz, 1-W CMOS Class-E Power Amplifier for Wireless Communications," IEEE Journal of Solid-State Circuits, vol. 34, Issue 7, Jul. 1999, pp. 962-970.
International Search Report and Written Opinion for International Patent Application No. PCT/NL2016/050375, dated Oct. 28, 2016, 15 pages.
International Preliminary Report on Patentability for International Patent Application No. PCT/NL2016/050375, dated Dec. 6, 2018, 11 pages.

\* cited by examiner

BALUN CIRCUIT ARRANGEMENT

This application is a 35 USC 371 National Phase filing of International Application No. PCT/NL2016/050375, filed May 26, 2016, the disclosure of which is incorporated herein by reference in its entirety.

TECHNICAL FIELD

The present invention relates to a balun circuit arrangement comprising a balanced port side having two balanced terminals and an unbalanced port side having an unbalanced terminal. In a further aspect, the present invention relates to a combination of an oscillator circuit and a balun circuit arrangement according to any one of the present invention embodiments, wherein the oscillator circuit provides an output signal at an output frequency and is connected to the balanced port side of the balun circuit arrangement.

BACKGROUND ART

In many RF communication applications, such as applications according to the ZigBee standard, use is made of a direct up-conversion transmitter architecture wherein a local oscillator is operating at twice the output frequency (operational transmitting frequency). This type of transmitter architecture is susceptible to oscillator injection pulling (or oscillator re-modulation), which is an unwanted effect in RF design. The article by B. Razavi, 'A Study of Injection Locking and Pulling in Oscillators', IEEE Journal of Solid-State Circuits, vol. 39, no. 9, September 2004, pp. 1415-1424, describes this phenomenon.

A possible solution to mitigate the effects of injection pulling would be to shift operation of the local oscillator to four times or two thirds of the output frequency, but this will result in increased power consumption and/or increased silicon area (if operating at two thirds of the output frequency).

SUMMARY OF INVENTION

The present invention seeks to provide an effective solution to mitigate the effects of injection pulling, without negative effects on cost and overall performance of the RF communication application.

According to the present invention, a balun circuit arrangement according to the preamble defined above is provided, wherein the balun circuit arrangement further comprises a first series connection of a first inductive impedance element and a first capacitive impedance element between a negative terminal of the two balanced terminals and the unbalanced terminal, a second series connection of a second inductive impedance element and a third inductive impedance element between a positive terminal of the two balanced terminals and the unbalanced terminal, wherein a second capacitive element is connected between a node connecting the second and third inductive element and a ground connection. This combination and structure of components provides a combination of balun and filtering capabilities, while at the same time mitigating injection pulling effects.

A very good effect is achieved in an embodiment wherein the first inductive impedance element is directly connected to the negative terminal of the two balanced terminals. If the two components in the first series connection are exchanged, i.e. in an embodiment wherein the first capacitive impedance element is directly connected to the negative terminal of the two balanced terminals, still effects of injection pulling are lessened.

In a further embodiment, the inductive and capacitive impedance elements comprise discrete components, i.e. using inductors and capacitors, thus forming a lumped balun circuit arrangement. One or more of the inductive and/or capacitive impedance elements may comprise a parallel circuit of an inductor and a capacitor in an even further embodiment. This may be by equivalence (e.g. by parasitic impedances), or by actual parallel connected components.

In a second aspect, the present invention relates to a combination of an oscillator circuit and a balun circuit arrangement as defined above, wherein the first inductive impedance element and the second inductive impedance element have a higher impedance value in a frequency region around a second harmonic frequency of the oscillator circuit as compared to in a frequency region around the output frequency of the oscillator circuit. This will provide for an effective suppression of injection pulling. Furthermore, the first inductive impedance element and the second inductive impedance element may have a peak impedance value in a frequency region around a second harmonic frequency of the oscillator circuit. Specific types of inductors are available that show such a characteristic, i.e. lower impedance below and above the frequency region. The present combination is especially effective in an embodiment wherein the oscillator circuit has a direct up-conversion transmitter architecture with a local oscillator operating at twice the output frequency, as such an oscillator circuit is known to be susceptive for injection pulling.

In a further embodiment, the oscillator circuit is an integrated circuit positioned on a printed circuit board and the balun circuit arrangement is implemented on the printed circuit board, e.g. on a single layer PCB, which yields a very cost-effective implementation. Alternatively, the combination is implemented as a single integrated circuit.

BRIEF DESCRIPTION OF DRAWINGS

The present invention will be discussed in more detail below, using a number of exemplary embodiments, with reference to the attached drawings, in which.

DESCRIPTION OF EMBODIMENTS

Radiofrequency (RF) communication applications are widespread, and the present invention embodiments relate to specific applications in low energy and moderate to low data rate RF communication applications, such as ZigBee and Bluetooth applications.

Figure 1:
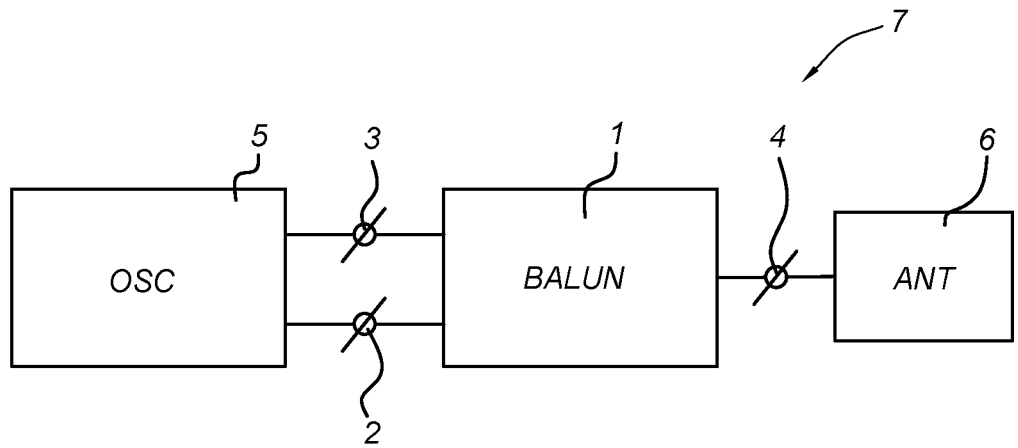
FIG. 1 shows a block diagram of a combination of an oscillator circuit, a balun circuit arrangement and antenna according to an embodiment of the present invention.

FIG. 1 shows a block diagram of a common set-up of an RF communication arrangement 7 wherein the present invention embodiments can be applied. Shown are an oscillator circuit 5 providing a balanced output signal as well as an antenna 6 for transmitting (and receiving) RF signals. The oscillator circuit 5 is e.g. implemented as a radio chip, such as a ZigBee or Bluetooth radio chip. In many applications, the antenna 6 is a single ended antenna, and a balun circuit arrangement 1 is used to transform the balanced (or differential) signal from the oscillator circuit 5 to an unbalanced signal to the antenna 6 (and vice versa). In FIG. 1 also the connecting terminals of the balun circuit arrangement 1 are shown, i.e. a balanced port side having two balanced terminals 2, 3 and an unbalanced port side having an unbalanced terminal 4.

In general all radio functions needed for a specific application are integrated in a radio chip (i.e. oscillator circuit 5 of FIG. 1), which e.g. comprises a local oscillator (e.g. a voltage controlled oscillator, VCO) and a power amplifier (PA) in the transmitter branch of the radio chip.

In direct up-conversion transmitter architectures, which are now commonly used in many RF communication applications, such as ZigBee and Bluetooth radio chips, oscillator injection pulling may be a problem and may cause unwanted effects such as error vector magnitude (EVM) degradation (or distortion) in the transmitter output signal. It has been found that indeed injection pulling may be the root cause of these effects. Reference is made to the article by B. Razavi mentioned in the paragraph Background art above.

According to the present invention embodiments, a solution for the problem of oscillator injection pulling is found by providing a properly designed balun circuit arrangement 1 connected to balanced output signal of the oscillator chip 5. In other words, a balun circuit arrangement 1 is provided as shown in the circuit diagram of FIG. 2, comprising a balanced port side having two balanced terminals 2, 3 and an unbalanced port side having an unbalanced terminal 4. A first series connection of a first inductive impedance element L1 and a first capacitive impedance element C1 is provided between a negative terminal 2 of the two balanced terminals 2, 3 and the unbalanced terminal 4, as well as a second series connection of a second inductive impedance element L2 and a third inductive impedance element L3 between a positive terminal 3 of the two balanced terminals 2, 3 and the unbalanced terminal 4, wherein a second capacitive element C2 is connected between a node b connecting the second and third inductive element L2, L3 and a ground connection.

By providing the first and second series connections directly connected to the balanced terminals 2, 3 to which an oscillator circuit 5 (see FIG. 4 below) is connected, the effects of injection pulling can be effectively mitigated. This is due to the mainly inductive nature of the first and second series connection directly at the balanced terminals 2, 3. Furthermore, this is accomplished with a balun circuit arrangement having a low part count, thus providing a very cost-efficient solution.

Figure 2:
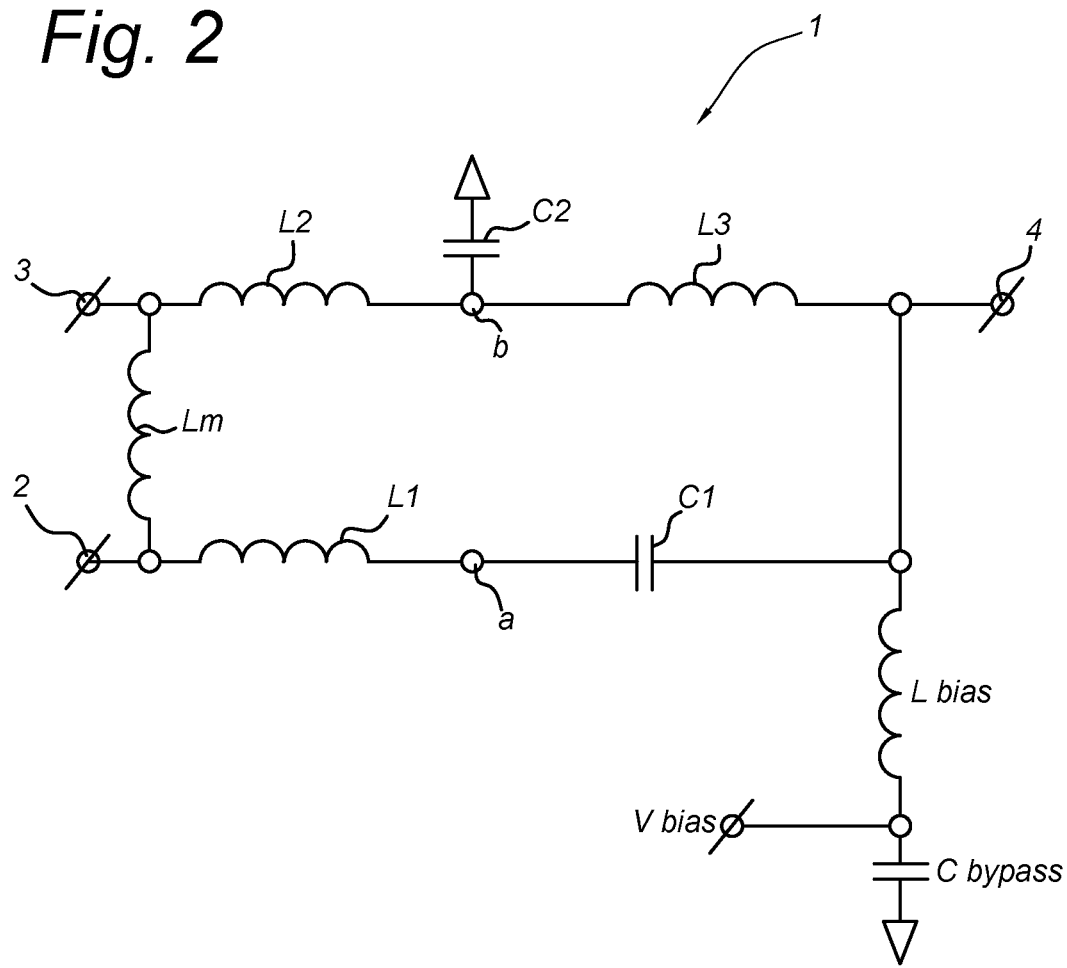
FIG. 2 shows a circuit diagram of a balun circuit arrangement according to an embodiment of the present invention.

In the circuit diagram of FIG. 2, the balun circuit arrangement 1 also comprises a fourth inductive impedance element Lm connected between nodes of the first series connection and nodes of the second series connection, in this specific embodiment directly between the two balanced terminals 2, 3. This fourth inductive element Lm is applied to cancel residue parasitic capacitance (of the connected oscillator circuit 5), but is also operative for a biasing function of the connected oscillator circuit 5. The biasing function is further implemented using a bias inductive impedance element Lbias connected between the unbalanced terminal 4 and a bias terminal Vbias. As shown this biasing may in the exemplary implementation as shown in FIG. 2 be accomplished using an additional bypass capacitive impedance element Cbypass connected to ground. It is noted that the fourth inductive impedance Lm and bias inductive impedance element Lbias may actually contribute to the desired characteristics of the balun circuit arrangement 1, i.e. providing a best combination of properties related to balun, filtering, injection pulling mitigation and for reducing the cost of circuit components.

In the embodiment of FIG. 2, the first inductive impedance element L1 is directly connected to the negative terminal 2 of the two balanced terminals 2, 3. As mentioned above, the direct connection of an inductive impedance element as close as possible to the oscillator circuit 5 connected to the two balanced terminals 2, 3 contributes to mitigation of injection pulling effects. In the second series connection, both series connected second and third inductive impedance elements L2 and L3 contribute to this mitigating effect.

Figure 3:
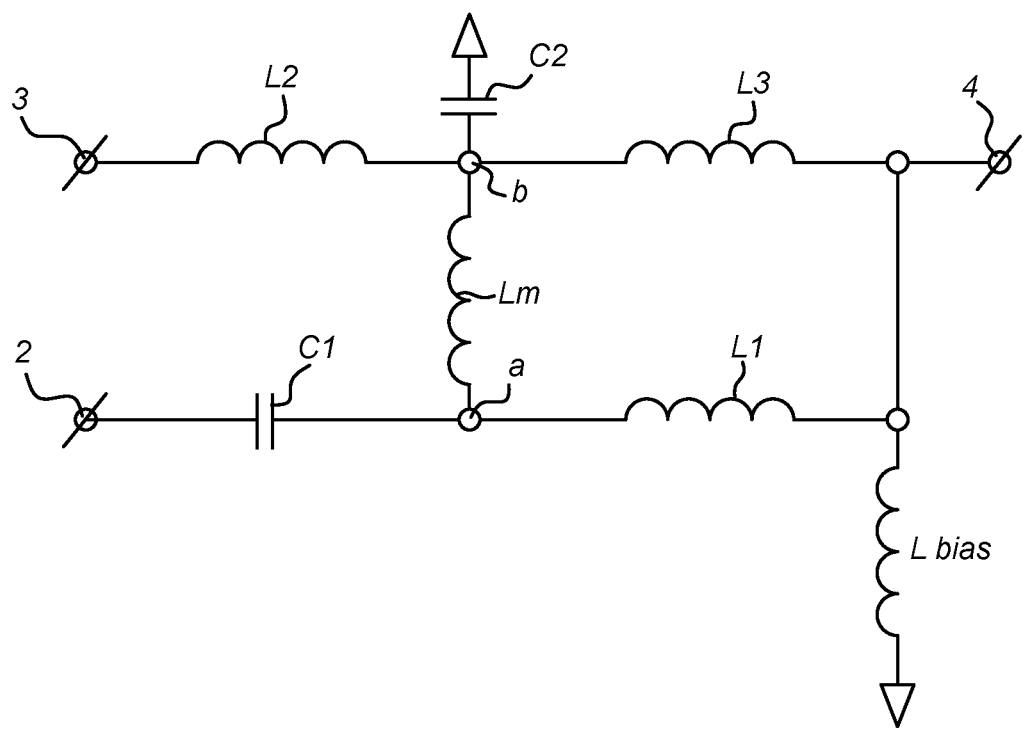
FIG. 3 shows a circuit diagram of an alternative embodiment of the balun circuit arrangement.

Alternatively, as shown in the alternative embodiment of FIG. 3, the first capacitive impedance element C1 is directly connected to the negative terminal 2 of the two balanced terminals 2, 3. As the first series connection C1, L1 is still of an overall inductive nature, the mitigating effect is maintained, especially with the second inductive impedance element L2 connected to the positive terminal 3.

Figure 4:
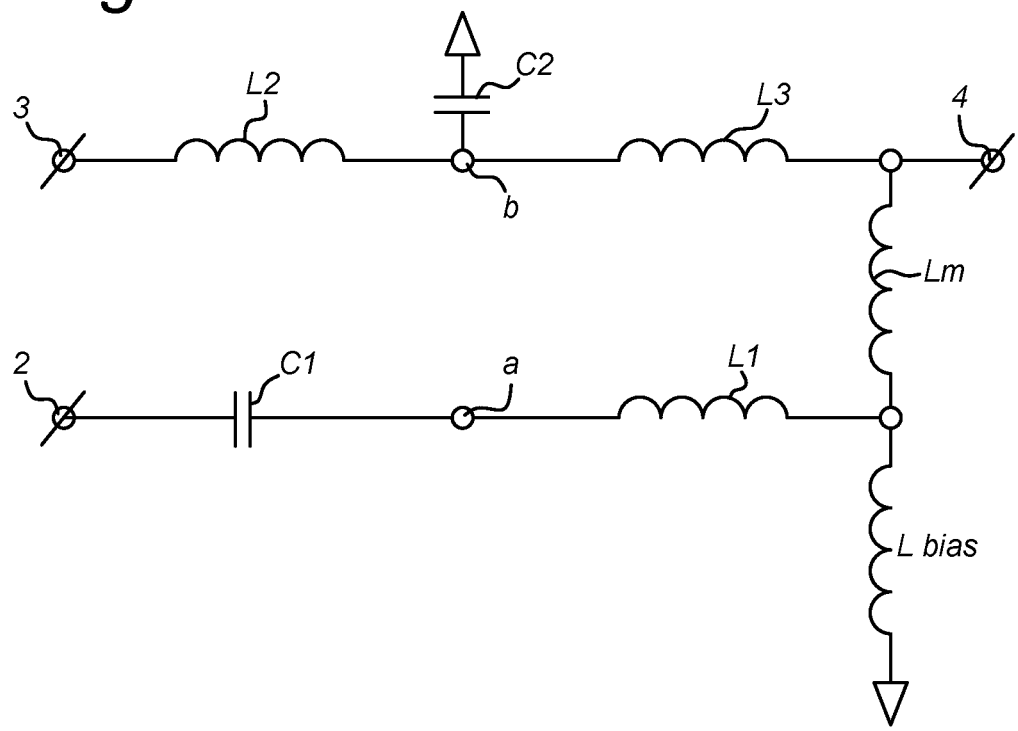
FIG. 4 shows a circuit diagram of a further alternative embodiment of the balun circuit arrangement.

In FIG. 3, the fourth inductive impedance element Lm is shown in an alternative position, i.e. connected between a node a of the first series connection L1, C1, and a node b of the second series connection L2, L3, C2. FIG. 4 shows yet a further alternative embodiment, wherein the fourth inductive impedance element Lm is connected between the unbalanced terminal 4 and the first inductive impedance element L1. Note that the electric small signal behavior of the three port balun circuit arrangement 1 is relevant for the functionality and effect of the present invention embodiments. The fourth inductive impedance element Lm in the FIG. 4 embodiment may thus be seen as part of the first series connection between the negative terminal 2 and unbalanced terminal 4.

Furthermore, it is noted that as an alternative for the embodiments as shown in FIG. 2-4, the bias inductive impedance element Lbias (and bias voltage terminal Vbias and additional bypass capacitive impedance element Cbypass) may be connected to the node a of the first series connection L1, C1.

The inductive and capacitive impedance elements as described above with reference to the embodiments of FIG. 2-4 may comprise discrete components, i.e. inductors and capacitors. This is particularly advantageous when the balun circuit arrangement is implemented as a lumped balun circuit on a printed circuit board (PCB) on which also the oscillator circuit 5 is positioned. By properly selecting the values of these components, the proper and desired characteristics of the balun circuit arrangement 1 may be obtained.

Furthermore, one or more of the inductive and/or capacitive impedance elements may comprise a parallel circuit of an inductor and a capacitor. This may be included in determining the balun circuit arrangement characteristics, by equivalence, but also when parasitic impedances are present, or if actual parallel components need to be used to obtain the proper element values.

The present invention embodiments as described above are functional in mitigating injection pulling of an oscillator circuit 5 connected to the balanced port side of the balun circuit arrangement 1. When having a single ended antenna 6 an additional benefit is provided that that a single layer printed circuit board can be used in an actual implementation, lowering the overall design cost requirements. Generally speaking single ended antennas have some advantages over balanced antennas and are used in many situations. However, if the balun circuit arrangement 1 is to be built on a single layer PCB there is a challenge of providing filtering efficiently, because single layer PCB does not support unbalanced signal propagation. The balun circuit arrangement according to the present invention embodiments can solve this problem with its filtering functionality.

In a further aspect the present invention relates to a combination 7 of an oscillator circuit 5 and a balun circuit arrangement 1 as described in the embodiments above. The oscillator circuit 5 provides an output signal at an output frequency and is connected to the balanced port side of the balun circuit arrangement 1. With designs based on smaller chips (oscillator circuit 5) which use lower currents and provide more output power, there occurs a larger dependency on pulling effects related to the circuit chain of VCO, PA in the oscillator circuit 5 and a load connected to the oscillator circuit 5. E.g. the VCO design may be based on 4.8 GHz to provide a 2.4 GHz output signal, the TX design may be implemented with direct up-conversion. Furthermore, a small-size, low-current design is desired, as well as a larger PA output power. Further, in an actual implementation, filtering is needed around the balun circuit arrangement function for regulatory requirements as defined by FCC and ETSI. Complicating factor may be that with a single layer PCB design there is no dedicated ground plane to support propagation of an unbalanced signal. Therefore designers of application circuits are seeking for a best combination of properties and characteristics related to balun, filtering, injection pulling mitigation and for reducing the cost of PCB and circuit components.

This may all be achieved in an embodiment of the present invention combination 7, wherein the first inductive impedance element L1 and the second inductive impedance element L2 (which are directly connected to the balanced terminals 2, 3) have a higher impedance value in a frequency region around a second harmonic frequency of the oscillator circuit 5 as compared to in a frequency region around the output (carrier) frequency of the oscillator circuit 5. This may be accomplished by selecting the right type and make of components forming the first and second inductive impedance elements L1, L2. Right value inductors, when considering their parasitics, can show parallel resonance in the vicinity of the second harmonic frequency, aiding in the mitigation of injection pulling. The same parasitic parallel resonances of the first, second and third inductive impedance elements L1, L2 and L3, also contribute most to the filter capacities of the balun circuit arrangement (second harmonic is the most difficult to be filtered, because it's frequency is closest to that of the signal among all harmonics). It is noted this filtering mechanism differs from a normal L-C ladder filter.

In alternative wording, the first inductive impedance element L1 and the second inductive impedance element L2 have a peak impedance value in a frequency region around a second harmonic frequency of the oscillator circuit 5. Specific types of inductors which are commercially available are having this characteristic, i.e. a lower impedance below and above the second harmonic frequency region.

In an exemplary embodiment, inductors and capacitors are used which are commercially available from the Murata LQG15HN series and GRM36COG series, respectively. Exemplary values for a ZigBee related application then are L1=5.6 nH; C1=0.6 pF; L2=6.2 nH; L3=6.8 nH; C2=0.6 pF; Lm=3.0 nH; Lbias=22 nH and Cbypass=10 pF. In the characteristics of these components it is noted that the 6.2 nH and the 5.6 nH inductors have a high impedance within the second harmonic frequency range of 4810-4960 MHz (ZigBee), while the inductors with either lower or higher values have a lower impedances in the second harmonic frequency range.

In implementations wherein the oscillator circuit 5 has a direct up-conversion transmitter architecture with a local oscillator operating at twice the output frequency, as described above for a ZigBee application, the effects of oscillator injection pulling is then mitigated.

In exemplary embodiments, the first inductive impedance element L1 and the second inductive impedance element L2 have a value of between 4 and 8 nH, e.g. 5 and 7 nH, respectively. The frequency region is e.g. from 4810 to 4960 MHz which is the $2^{nd}$ harmonic band in case of ZigBee applications.

In the implementation of the present invention embodiments as described above with reference to FIG. 1, the combination 7 also comprises an antenna 6 connected to the unbalanced port side of the balun circuit arrangement 1, e.g. a single ended antenna like an inverted F antenna. In an embodiment, the oscillator circuit 5 may be (part of) an integrated circuit positioned on a printed circuit board (PCB) and the balun circuit arrangement 1 may be implemented on the (single layer) printed circuit board. As an alternative, the combination 7 of the present invention is implemented as a single integrated circuit.

For the present invention embodiments, it is easier to adapt the design to suit different practical situations, than that of a traditional balun circuit arrangement, especially if a single layer PCB implementation is considered. A single layer PCB does not support unbalanced signal propagation, so no filter can be connected after a traditional balun circuit arrangement. In such a case, a traditional balun circuit arrangement has to function between the differential impedance of the oscillator circuit 5 and the single ended impedance of the antenna 6, at the required frequency. On the other hand, the traditional balun circuit arrangement has only two component values L and C which can be selected. For this reason in general a traditional balun circuit arrangement can at best sub-optimally work for a single layer PCB implementation. For the present invention balun circuit arrangement 1, although it also needs to cope with the same situation, it has much more freedom to adjust component values to ensure a satisfactory functioning.

The present invention embodiments have been described above with reference to a number of exemplary embodiments as shown in the drawings. Modifications and alternative implementations of some parts or elements are possible, and are included in the scope of protection as defined in the appended claims.

The invention claimed is:
1. A balun circuit arrangement comprising:
   a balanced port side having two balanced terminals and an unbalanced port side having an unbalanced terminal,
   a first series connection of a first inductive impedance element and a first capacitive impedance element between a negative terminal of the two balanced terminals and the unbalanced terminal,
   a second series connection of a second inductive impedance element and a third inductive impedance element between a positive terminal of the two balanced terminals and the unbalanced terminal, wherein a second capacitive impedance element is connected between a node connecting the second and third inductive impedance elements and a ground connection, and
   a fourth inductive impedance element connected between the first inductive impedance element and the third inductive impedance element.

2. The balun circuit arrangement according to claim 1, wherein the first inductive impedance element is directly connected to the negative terminal of the two balanced terminals.

3. The balun circuit arrangement according to claim 1, wherein the first capacitive impedance element is directly connected to the negative terminal of the two balanced terminals.

4. The balun circuit arrangement according to claim 1, wherein the fourth inductive impedance element is connected between nodes of the first series connection and nodes of the second series connection.

5. The balun circuit arrangement according to claim 1, further comprising a bias inductive impedance element connected between the unbalanced terminal and a bias terminal.

6. The balun circuit arrangement according to claim 1, wherein the inductive and capacitive impedance elements comprise discrete components.

7. The balun circuit arrangement according to claim 1, wherein one or more of the inductive and/or capacitive impedance elements comprise a parallel circuit of an inductor and a capacitor.

8. The balun circuit arrangement according to claim 1, wherein the balun circuit arrangement is combined with an oscillator circuit, and wherein the oscillator circuit provides an output signal at an output frequency and is connected to the balanced port side of the balun circuit arrangement, and the first inductive impedance element and the second inductive impedance element have a higher impedance value in a frequency region around a second harmonic frequency of the oscillator circuit as compared to in a frequency region around the output frequency of the oscillator circuit.

9. The balun circuit arrangement according to claim 8, wherein the first inductive impedance element and the second inductive impedance element have a peak impedance value in a frequency region around a second harmonic frequency of the oscillator circuit.

10. The balun circuit arrangement according to claim 8, wherein the oscillator circuit has a local oscillator operating at twice the output frequency.

11. The balun circuit arrangement according to claim 8, wherein the first inductive impedance element and the second inductive impedance element have a value of between 4 and 8 nH, e.g. 5 and 7 nH, respectively.

12. The balun circuit arrangement according to claim 8, wherein the frequency region is from 4810 to 4960 MHz.

13. The balun circuit arrangement according to claim 8, further comprising an antenna connected to the unbalanced port side of the balun circuit arrangement.

14. The balun circuit arrangement according to claim 8, wherein the oscillator circuit is an integrated circuit positioned on a printed circuit board and the balun circuit arrangement is implemented on the printed circuit board.

15. The balun circuit arrangement according to claim 8, wherein the combination is implemented as a single integrated circuit.

* * * * *